US011788708B2

(12) United States Patent
Okahisa et al.

(10) Patent No.: US 11,788,708 B2
(45) Date of Patent: Oct. 17, 2023

(54) LENS AND LIGHT EMITTING DEVICE

(71) Applicant: NICHIA CORPORATION, Anan (JP)

(72) Inventors: Tsuyoshi Okahisa, Tokushima (JP); Toshiyuki Fujii, Anan (JP)

(73) Assignee: NICHIA CORPORATION, Anan (JP)

( * ) Notice: Subject to any disclaimer, the term of this patent is extended or adjusted under 35 U.S.C. 154(b) by 136 days.

(21) Appl. No.: 17/106,182

(22) Filed: Nov. 30, 2020

(65) Prior Publication Data

US 2021/0102683 A1 Apr. 8, 2021

Related U.S. Application Data

(62) Division of application No. 16/556,240, filed on Aug. 30, 2019, now Pat. No. 10,883,700.

(30) Foreign Application Priority Data

Aug. 31, 2018 (JP) ................................. 2018-162678

(51) Int. Cl.
| | | |
|---|---|---|
| *H01L 33/56* | (2010.01) | |
| *H01L 21/56* | (2006.01) | |
| *F21V 5/04* | (2006.01) | |
| *B29D 11/00* | (2006.01) | |
| *G02B 1/04* | (2006.01) | |

(Continued)

(52) U.S. Cl.
CPC ........ *F21V 5/045* (2013.01); *B29D 11/00009* (2013.01); *G02B 1/041* (2013.01); *H01L 21/565* (2013.01); *H01L 33/56* (2013.01); *B29K 2101/10* (2013.01); *H01L 33/54* (2013.01)

(58) Field of Classification Search
CPC .............. F21V 5/045; B29D 11/00009; B29D 11/00798; B29D 11/00269; G02B 1/041; H01L 33/54; H01L 33/56; H01L 21/565; B29K 2101/10; F21K 9/69; F21K 9/90
See application file for complete search history.

(56) References Cited

U.S. PATENT DOCUMENTS 3,612,853 A * 10/1971 Aoki .................... F21V 23/0414
248/205.3
4,035,681 A *  7/1977 Savage, Jr. ................ G09F 9/33
362/311.1

(Continued)

FOREIGN PATENT DOCUMENTS

| CN | 1929159 | 3/2007 |
| CN | 101526654 | 9/2009 |

(Continued)

OTHER PUBLICATIONS

Restriction Requirement issued by the U.S. Patent and Trademark Office for the parent U.S. Appl. No. 16/556,240, dated Jul. 31, 2020.

(Continued)

*Primary Examiner* — Jarrett J Stark
(74) *Attorney, Agent, or Firm* — MORI & WARD, LLP

(57) ABSTRACT

A lens includes a cover part and a light-shielding part. The cover part includes a lens part, a connection part, and a flange part which are formed of a thermosetting first resin and continuous to one another. The light-shielding part covers an outer lateral side of the connection part and is formed of a second resin having a greater light-absorptance or a greater light-reflectance than the first resin.

13 Claims, 12 Drawing Sheets

(51) Int. Cl.
 *B29K 101/10* (2006.01)
 *H01L 33/54* (2010.01)

(56) References Cited

U.S. PATENT DOCUMENTS

| | | | |
|---|---|---|---|
| 5,101,327 A | 3/1992 | Jewett et al. | |
| 5,130,531 A * | 7/1992 | Ito | H01L 31/167 |
| | | | 257/434 |
| 5,477,441 A * | 12/1995 | Budnovitch | F21S 8/033 |
| | | | 362/267 |
| 6,052,232 A * | 4/2000 | Iwaki | G02B 7/022 |
| | | | 359/811 |
| 6,614,602 B1 * | 9/2003 | Huang | B29D 11/00 |
| | | | 359/811 |
| 6,720,944 B1 * | 4/2004 | Ishii | G02F 1/1339 |
| | | | 345/87 |
| 6,819,376 B1 * | 11/2004 | Muramatsu | G02F 1/13452 |
| | | | 349/110 |
| 9,863,605 B2 * | 1/2018 | Haitz | F21V 13/08 |
| 2003/0025117 A1 * | 2/2003 | Isokawa | H01L 33/60 |
| | | | 257/E33.072 |
| 2004/0190286 A1 * | 9/2004 | Chapman | F21L 4/027 |
| | | | 362/171 |
| 2005/0046010 A1 * | 3/2005 | Vittu | H01L 31/0203 |
| | | | 257/E31.127 |
| 2005/0083686 A1 * | 4/2005 | Yatsuda | F21V 29/89 |
| | | | 362/230 |
| 2005/0099805 A1 * | 5/2005 | Chapman | F21V 5/048 |
| | | | 362/184 |
| 2005/0179863 A1 * | 8/2005 | Taguchi | G02C 7/02 |
| | | | 351/159.39 |
| 2005/0265019 A1 | 12/2005 | Sommers et al. | |
| 2006/0044806 A1 * | 3/2006 | Abramov | F21V 5/007 |
| | | | 362/337 |
| 2006/0072199 A1 * | 4/2006 | Morishita | B29D 11/0278 |
| | | | 359/542 |
| 2006/0226774 A1 * | 10/2006 | Sofue | C08G 77/18 |
| | | | 257/E33.059 |
| 2006/0239000 A1 * | 10/2006 | McDermott, Sr. | F21V 14/02 |
| | | | 362/240 |
| 2007/0195418 A1 | 8/2007 | Kogure et al. | |
| 2007/0205425 A1 | 9/2007 | Harada | |
| 2008/0055901 A1 * | 3/2008 | Sanpei | F21V 31/04 |
| | | | 257/E33.072 |
| 2009/0008662 A1 * | 1/2009 | Ashdown | H01L 25/0753 |
| | | | 257/E33.059 |
| 2009/0122242 A1 * | 5/2009 | Nakamura | G02F 1/13394 |
| | | | 349/110 |
| 2009/0225157 A1 | 9/2009 | Orihara et al. | |
| 2009/0298376 A1 | 12/2009 | Guillien et al. | |
| 2010/0061106 A1 * | 3/2010 | Shyu | G02B 3/08 |
| | | | 359/742 |
| 2010/0155768 A1 * | 6/2010 | Lin | H01L 21/486 |
| | | | 257/E33.059 |
| 2010/0155769 A1 * | 6/2010 | Lin | H01L 21/486 |
| | | | 257/E33.059 |
| 2010/0181594 A1 * | 7/2010 | Lin | H01L 21/486 |
| | | | 257/E33.056 |
| 2011/0063487 A1 * | 3/2011 | Yamada | B29D 11/00307 |
| | | | 359/503 |
| 2011/0065241 A1 * | 3/2011 | Lin | H01L 33/642 |
| | | | 438/118 |
| 2011/0141742 A1 * | 6/2011 | Tanaka | F21S 41/155 |
| | | | 362/294 |
| 2011/0188252 A1 * | 8/2011 | Lin | F21V 29/00 |
| | | | 362/294 |
| 2011/0228398 A1 | 9/2011 | Sakaki et al. | |
| 2011/0261569 A1 * | 10/2011 | Kayanuma | F21S 41/143 |
| | | | 362/339 |
| 2011/0272833 A1 * | 11/2011 | Tsai | B29C 45/16 |
| | | | 264/254 |
| 2012/0099326 A1 * | 4/2012 | Hammond | F21S 43/14 |
| | | | 438/27 |
| 2012/0104435 A1 * | 5/2012 | Lee | H01L 33/54 |
| | | | 257/E33.061 |
| 2012/0162997 A1 * | 6/2012 | Birkholz | F21V 5/04 |
| | | | 362/311.06 |
| 2012/0199727 A1 | 8/2012 | Kubota | |
| 2013/0027922 A1 | 1/2013 | Chen | |
| 2013/0120707 A1 * | 5/2013 | Shan | B29D 11/0073 |
| | | | 351/159.01 |
| 2013/0153934 A1 * | 6/2013 | Meitl | G09F 9/3026 |
| | | | 438/24 |
| 2013/0299852 A1 * | 11/2013 | Onai | H01L 33/08 |
| | | | 438/28 |
| 2013/0335955 A1 * | 12/2013 | Lee | F21V 14/065 |
| | | | 362/190 |
| 2015/0075025 A1 | 3/2015 | Peil et al. | |
| 2015/0137163 A1 * | 5/2015 | Harris | H01L 33/58 |
| | | | 257/98 |
| 2016/0010826 A1 * | 1/2016 | Tsukatani | F21V 13/14 |
| | | | 362/510 |
| 2016/0077244 A1 * | 3/2016 | Saito | B29C 33/3842 |
| | | | 362/311.06 |
| 2016/0254500 A1 | 9/2016 | Kawata et al. | |
| 2016/0320472 A1 * | 11/2016 | Okushiba | H01L 31/02325 |
| 2016/0377258 A1 | 12/2016 | Xu et al. | |
| 2017/0227190 A1 * | 8/2017 | Fujikawa | B29C 39/24 |
| 2017/0294560 A1 * | 10/2017 | Ho | H01L 31/0203 |
| 2017/0317251 A1 | 11/2017 | Sweegers et al. | |
| 2017/0370539 A1 | 12/2017 | Xu et al. | |
| 2018/0195677 A1 | 7/2018 | Konagayoshi et al. | |
| 2018/0231777 A1 * | 8/2018 | Yoon | B29D 11/00269 |
| 2018/0231778 A1 * | 8/2018 | Yoon | G02B 3/08 |
| 2018/0306405 A1 | 10/2018 | Kong | |
| 2018/0323354 A1 * | 11/2018 | Wang | H01L 33/58 |
| 2019/0264890 A1 | 8/2019 | Chang et al. | |
| 2019/0267518 A1 | 8/2019 | Hino et al. | |
| 2019/0302323 A1 * | 10/2019 | Tsai | B29D 11/00269 |
| 2020/0073074 A1 * | 3/2020 | Kishimoto | B29D 11/00269 |
| 2022/0146074 A1 * | 5/2022 | Kiba | F21V 5/043 |
| 2022/0282851 A1 * | 9/2022 | De Bevilacqua | F21V 5/04 |

FOREIGN PATENT DOCUMENTS

| | | | |
|---|---|---|---|
| CN | 102576093 | | 7/2012 |
| CN | 102856478 | | 1/2013 |
| CN | 204678257 U | * | 9/2015 |
| CN | 204678257 U | | 9/2015 |
| CN | 205137343 U | | 4/2016 |
| CN | 107167985 | | 9/2017 |
| CN | 207133557 U | | 3/2018 |
| CN | 207702153 U | | 8/2018 |
| CN | 114183726 A | * | 3/2022 |
| JP | 06-079013 U | | 11/1994 |
| JP | 2002-289926 | | 10/2002 |
| JP | 2004179544 A | * | 6/2004 |
| JP | 2004186309 A | * | 7/2004 |
| JP | 2006-216887 | | 8/2006 |
| JP | 2010-040801 | | 2/2010 |
| JP | 2010-040802 | | 2/2010 |
| JP | 5139915 B2 | | 2/2010 |
| JP | 2010040802 A | * | 2/2010 |
| JP | 2010-103404 | | 5/2010 |
| JP | 2011-054829 | | 3/2011 |
| JP | 2011-062879 | | 3/2011 |
| JP | 2011-197479 | | 10/2011 |
| JP | 2012-119185 | | 6/2012 |
| JP | 2012-185239 | | 9/2012 |
| JP | 2012-185240 | | 9/2012 |
| JP | 2014-006488 | | 1/2014 |
| JP | 2015-090776 | | 5/2015 |
| JP | 2015-090781 | | 5/2015 |
| JP | 2016-164874 | | 9/2016 |
| JP | 2016-194568 | | 11/2016 |
| JP | 2017-533590 | | 11/2017 |
| WO | WO-2006021837 A1 * | 3/2006 | F21V 17/06 |
| WO | WO 2013/164054 | | 11/2013 |
| WO | WO 2015/025970 | | 2/2015 |

(56) References Cited

FOREIGN PATENT DOCUMENTS

WO  WO 2015/146539   10/2015
WO  WO 2017/047358   3/2017

OTHER PUBLICATIONS

Notice of Allowance with Form PTO-892 Notice of References Cited issued by the United States Patent and Trademark Office for the parent U.S. Appl. No. 16/556,240, dated Oct. 19, 2020.

* cited by examiner

LENS AND LIGHT EMITTING DEVICE

CROSS-REFERENCE TO RELATED PATENT APPLICATION

The present application is a divisional application of the U.S. patent application Ser. No. 16/556,240 filed Aug. 30, 2019, which claims priority under 35 U.S.C. § 119 to Japanese Patent Application No. 2018-162678, filed Aug. 31, 2018. The contents of these applications are incorporated herein by reference in their entirety.

BACKGROUND OF THE INVENTION

Field of the Invention

The present disclosure relates to a lens and a light emitting device.

Discussion of the Background

Applications for flush light sources used in cellular phones and other mobile devices, a light emitting device may include an LED element mounted on a circuit board, a cover having an optical lens facing the LED element, and a light-reflecting member integrally formed with the cover, for example, described in Japanese patent publication No. 5139915. In the light emitting device described in Japanese patent publication No. 5139915, a metal film is used as the light-reflecting member and the metal film is formed by way of, for example, vacuum vapor deposition.

SUMMARY OF THE INVENTION

A lens according to one embodiment of the present disclosure includes a cover part and a light-shielding part. The cover part includes a lens part, a connection part connected to an outer periphery of the lens part, and a flange part connected to a lower-end portion of an outer periphery of the connection part. The lens part and the connection part define a recess opening downward, the lens part defines a bottom surface of the recess, and the connection part defines lateral surfaces of the recess and surrounding the opening of the recess. The flange part extends outward from a periphery of the recess. The lens part, the flange part, and the connection part are formed of a thermosetting first resin and continuous to one another. The light-shielding part covers an outer lateral side of the connection part and is formed of a thermosetting second resin having a greater light-absorptance or a greater light-reflectance than the first resin.

A lens according to another embodiment of the present disclosure includes a cover part and a light-shielding part. The cover part includes a lens part, a connection part connected to an outer periphery of the lens part, and a flange part connected to a lower-end portion of an outer periphery of the connection part. The lens part, the flange part, and the connection part are formed of a thermosetting first resin and continuous to one another, with a thickness of the flange part in a range of 5 µm to 30 µm. The light-shielding part covers an outer lateral side of the connection part and is formed of a second resin having a greater light-absorptance or a greater light-reflectance than the first resin.

A light emitting device according to further embodiment of the present disclosure includes a light emitting element and a lens. The lens includes a cover part and a light-shielding part. The cover part includes a lens part, a connection part connected to an outer periphery of the lens part, and a flange part connected to a lower-end portion of an outer periphery of the connection part. The lens part and the connection part define a recess opening downward, the lens part defines a bottom surface of the recess and the connection part defines lateral surfaces of the recess and surrounding the opening of the recess. The flange part extends outward from a periphery of the recess. The lens part, the flange part, and the connection part are formed of a thermosetting first resin and continuous to one another. The light-shielding part covers an outer lateral side of the connection part and is formed of a thermosetting second resin having a greater light-absorptance or a greater light-reflectance than the first resin. The lens part is disposed at a location that allows light from the light emitting element to be transmitted through the lens part.

A light emitting device according to further embodiment of the present disclosure includes a light emitting element and a lens. The lens includes a cover part and a light-shielding part. The cover part includes a lens part, a connection part connected to an outer periphery of the lens part, and a flange part connected to an outer periphery of the connection part. The lens part, the flange part, and the connection part are formed of a thermosetting first resin and continuous to one another, with a thickness of the flange part in a range of 5 µm to 30 µm. The light-shielding part covers an outer lateral side of the connection part and is formed of a second resin having a greater light-absorptance or a greater light-reflectance than the first resin. The lens part is disposed at a location that allows light from the light emitting element to be transmitted through the lens part.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

In the following, certain embodiments will be described with reference to the drawings. However, the embodiments shown below exemplify lenses, light emitting devices for embodying the technical idea of the present invention, and the technical idea of the present invention is not limited thereto. The sizes, materials, shapes and the relative positions of the members described in the embodiments are given as examples and are not as a limitation to the scope of the invention unless specifically stated. The sizes and positional relationships of the members in each of drawings are occasionally shown exaggerated for ease of explanation.

First Embodiment

Figure 1:
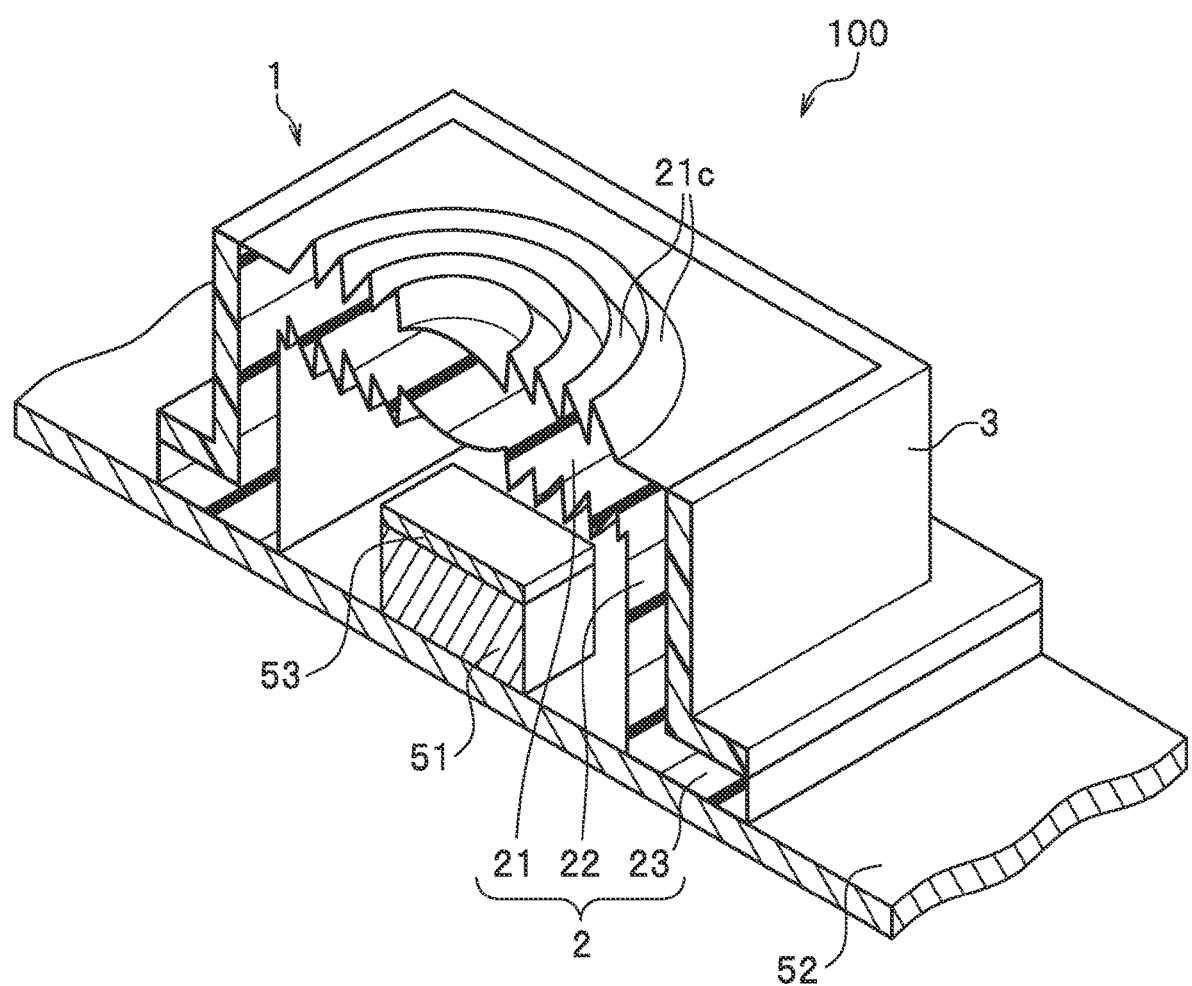
FIG. 1 is a perspective sectional view schematically showing a structure of a light emitting device that includes a lens according to a first embodiment, taken along a line passing through the center of the light emitting device.
Figure 2:
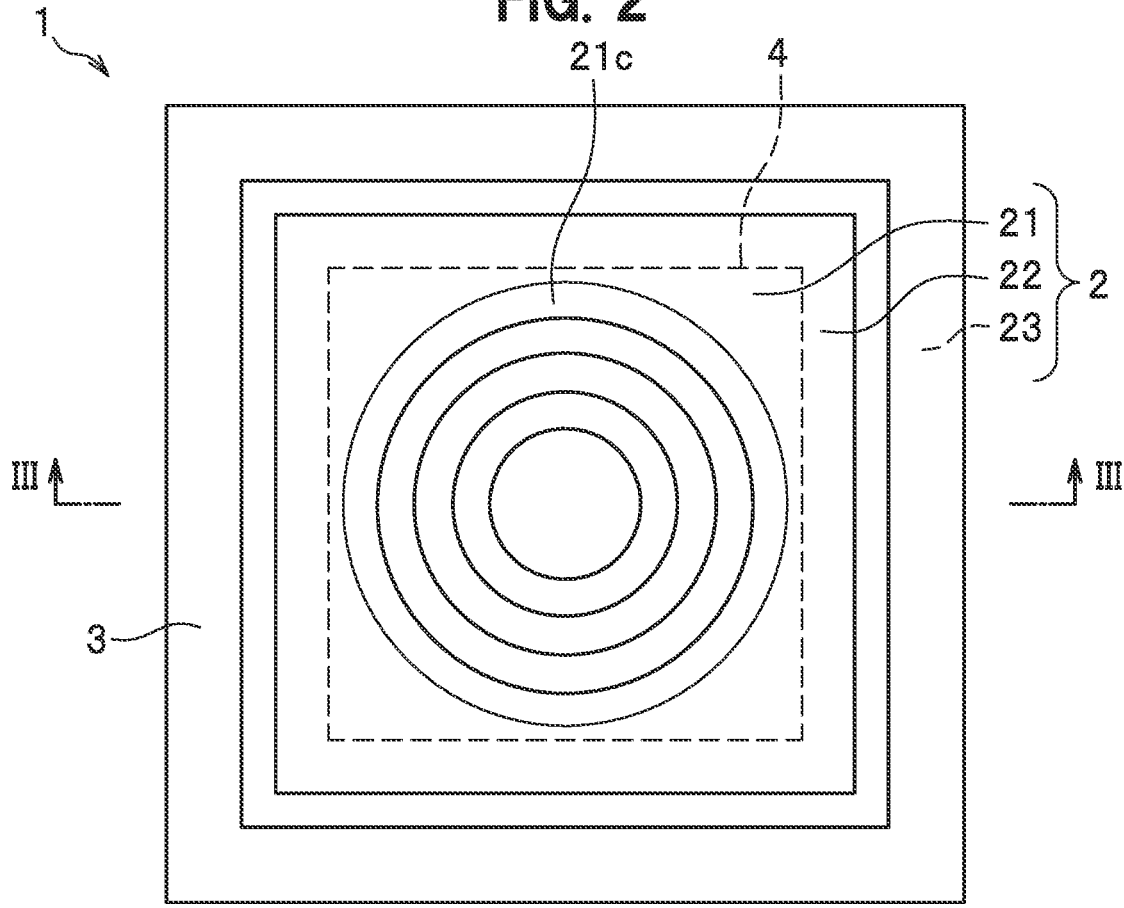
FIG. 2 is a plan view schematically showing a structure of a lens according to the first embodiment.
Figure 3:
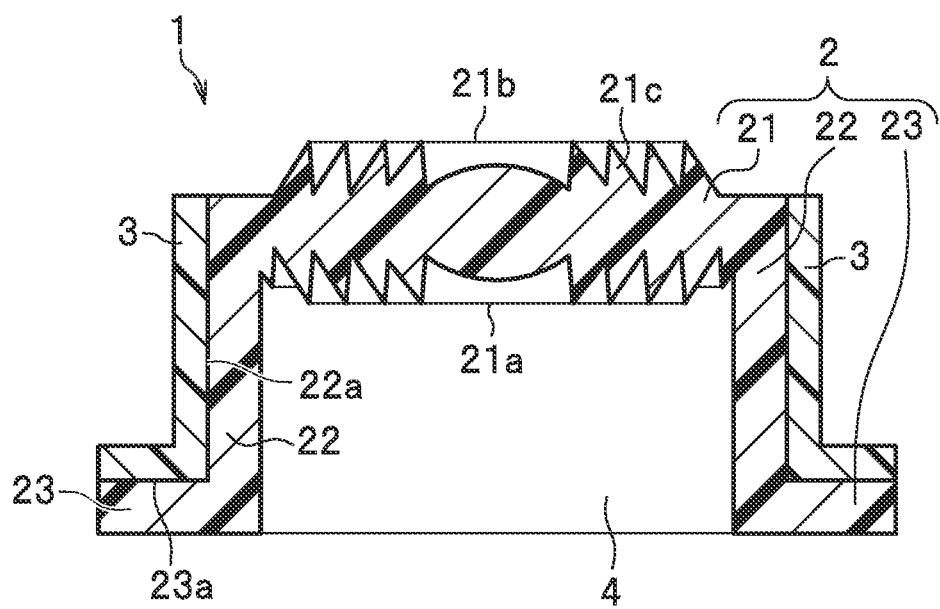
FIG. 3 is a cross-sectional view, taken along line III-III of FIG. 2, schematically showing a structure of a lens according to the first embodiment, in which the line is passing through the center of the lens.
Figure 4:
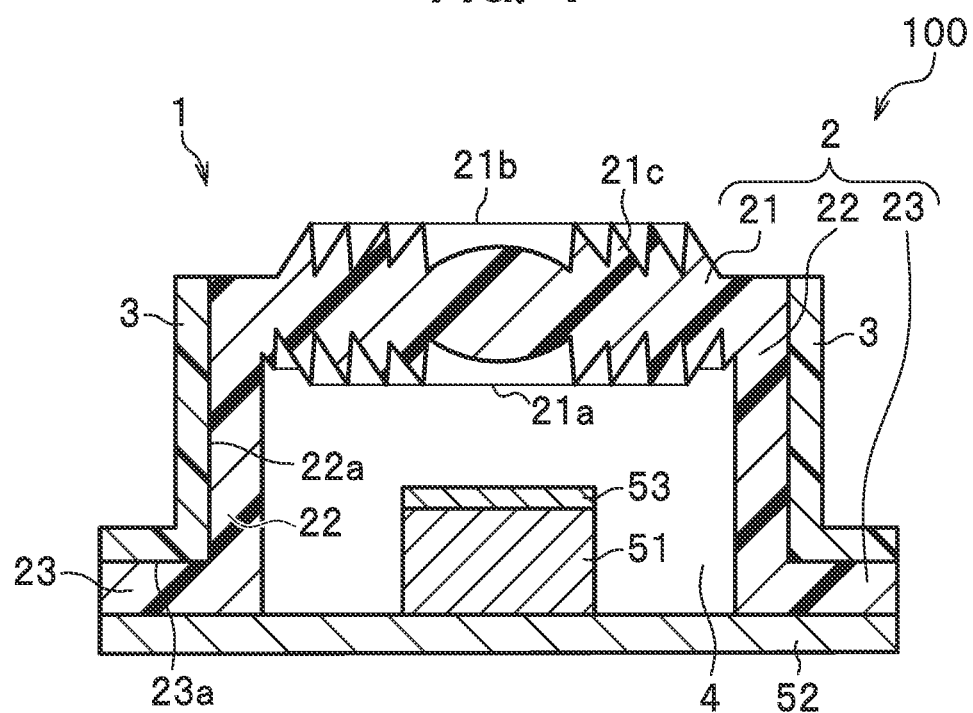
FIG. 4 is a cross-sectional view schematically showing a structure of a light emitting device according to the first embodiment, taken along a line passing through the center of the light emitting device.

FIG. 1 is a perspective sectional view schematically showing a structure of a light emitting device that includes a lens according to a first embodiment, taken along a line passing through the center of the light emitting device. FIG. 2 is a plan view schematically showing a structure of a lens according to the first embodiment. FIG. 3 is a cross-sectional view, taken along line III-III of FIG. 2, schematically showing a structure of a lens according to the first embodiment, in which the line is passing through the center of the lens. FIG. 4 is a cross-sectional view schematically showing a structure of a light emitting device according to the first embodiment, where the light emitting device is cut through its center.

The light emitting device 100 includes a light emitting element 51 and a lens 51. The light emitting device 100 further includes a substrate 52 on which the light emitting element 51 is mounted.

Lens

Lens 1 will be described.

The lens 1 includes a cover part 2 and a light-shielding part 3.

The cover part 2 of the lens 1 includes a lens part 21, a connection part 22 connected to an outer periphery of the lens part 21, and a flange part 23 connected to a lower-end portion of an outer periphery of the connection part 22. The lens part 21, the connection part 22, and the flange part 23 are formed of a thermosetting first resin and continuous to one another. The light-shielding part 3 of the lens 1 covers an outer lateral side of the connection part 22 and formed of a thermosetting second resin having a greater light-absorptance or a greater light-reflectance than the first resin. For example, the lens 1 is used as a flash lens for a cellular phone or the like.

Cover Part

The cover part 2 includes a lens part 21, a flange part 23, and a connection part 22, which are formed of the thermosetting first resin and continuous to one another. In the cover part 2, the lens part 21 and the connection part 22 define a recess 4 opening downward, and the flange part 23 extends outward from a periphery of the recess 4.

The lens part 21 is a member through which light from the light emitting element 51 can be emitted to the outside in parallel light, condensed light, or diffused light. The lens part 21 has a light incidence surface 21a for receiving light emitted from the light emitting element 51 enters, and a light emitting surface 21b at an opposite side to the light incidence surface 21a, where the incident light is refracted and is emitted to the outside.

The outer shape in a plan view of the lens part 21 can be selected from various appropriate shapes, examples thereof include a polygonal shape such as a quadrangular shape, a hexagonal shape, and an octagonal shape, a circular shape and an elliptic shape. A center portion of the lens part 21 that serves as a lens preferably has a circular shape or an elliptic shape, where a circular shape is more preferable. The lens part 21 has a maximum thickness of, for example, in a range of 0.1 mm to 10 mm, preferably in a range of 0.5 mm to 5 mm.

For the lens part 21, a Fresnel lens, a total internal reflection (TIR) lens, or the like can be used, in which, a Fresnel lens is preferable. The Fresnel lens 21 may have either a single lens-center or a plurality of lens-centers. When a plurality of Fresnel lenses 21 are employed, the Fresnel lenses are arranged corresponding to the arrangement of the light emitting elements 51, such that an odd number of Fresnel lenses are preferably arranged in a zigzag form, and an even number of Fresnel lenses are preferably arranged in a square matrix form.

The Fresnel lens 21 includes a plurality of concentric circles of ridges 21c on the light incidence surface 21a and on the light emitting surface 21b. When combined, the cross-sectional shapes of the plurality of ridges 21c form a lens curved surface of a single convex lens. The plurality of ridges 21c are preferably arranged in concentric circles or concentric ellipsoids in a radial direction of the Fresnel lens 21. In the Fresnel lens 21, the base plane of the plurality of ridges 21c can be flat, or concave or convex.

Each of the ridges 21c has a profile formed with a straight portion at the center-side and a segment of lens curve at the outer-side. The profile of each of the ridges 21c may be formed with inwardly curved segment either a concave curve or a convex curve, in conformity to the direction of light to be emitted. The angles (Fresnel angles) at the tips of the ridges 21c are adjusted such that light from the light emitting element 51 is emitted to the outside in parallel light.

The connection part 22 is connected to the lateral sides of the lens part 21 such that an upper end portion of the connection part 22 is contiguous to an upper end portion of the lateral sides of the lens part 21, and the connection part 22 is extended downward in a right angle with respect to the lens part 21, and a lower-end portion of the connection part 22 is contiguous to the flange part 23 in, for example, a right angle. The connection part 22 and the lens part 21 define a recess 4 opening downward to accommodate a light emitting element 51. In a cross-sectional view, the recess 4 is preferably a rectangular U-shape, but a semicircular shape or a semi-elliptical shape can also be employed. The lens part 21 has a rectangular outer peripheral shape in a plan view, such that the connection part 22 is disposed with respect to all the sides of the connection part 22, in which each two opposite sides of the connection part 22 are substantially in parallel to each other. The lens part 22 has a thickness of, for example, in a range of 50 µm to 200 µm, preferably in a range of 50 µm to 100 µm. The connection part 22 is preferably formed such that the lens part 21 locates at a center of a bottom surface of the recess.

The flange part 23 is formed contiguous to a lower-end portion of a corresponding one of the plurality of outer lateral sides of the connection part 22, and extends outward at a substantially right angle with respect to the corresponding outer lateral side of the connection part 22. The flange part 23 is, preferably a plate-shaped member surrounding the outer periphery of the connection part 22, and is used to be bonded or secured to the substrate 52 having the light emitting element 51 mounted thereon.

The flange part 23 preferably has a thickness in a range of 5 µm to 30 µm. The flange part 23 has a thickness reduced to the range of 5 µm to 30 µm, such that when used as a lens 1, leaking of light to a lateral side of the lens 1, particularly leaking of light through the flange part 23 can be reduced. The flange part 23 preferably has a thickness not greater than 20 µm.

The length of the flange part 23 protruded outward from the lower end of the connection part 22 is preferably in a range of 200 µm to 3,000 µm. With this arrangement, stable bonding or stable securing of the flange part 23 with the substrate 52 can be obtained. Further, bonding to the substrate 52 can be facilitated by applying an adhesive material on the flange part 23.

The first resin used for the cover part 2 is preferably a light-transmissive thermosetting resin. Examples of the thermosetting resin include a phenol resin, a urea resin, a melamine resin, epoxy resin, a silicone resin, a polyurethane resin, etc., and a silicone resin is preferably used. Thus, compared to conventionally-used thermoplastic resin such as polycarbonate, the use of thermosetting resin having higher optical resistance and/or thermal resistance can reduce degradation of the cover part 2, and further, can reduce degradation with passage of time, in which exponentially developing blackening due to concentration of light and heat in portions that discolored by degradation. Further, silicone resin exhibits a low viscosity, which can facilitate molding of the flange part 23 with a small thickness.

Light-Shielding Part

The light-shielding part 3 covers an outer lateral surfaces 22a of the connection part 22 and an upper surface 23a of the flange part 23. The light-shielding part 3 is formed of the second resin having a greater light absorptance or a greater light reflectance than the first resin.

The light-shielding part 3 is formed along the shape of the connection part 22 and the flange part, with a substantially uniform thickness. More specifically, the light-shielding part 3 has a cross-sectional shape along the outer lateral surfaces 22a of the connection part 22 and the upper surface 23a of the flange part 23, and for example, a cross-sectional shape of an L-shape. The light-shielding part 3 preferably has a thickness; that is, a thickness normal to a lateral surface of the connection part 22 or a thickness normal to the upper surface of the flange part 23, in a range of 200 µm to 3,000 µm. With this arrangement, the light-shielding part 3 can reliably cover the outer lateral surfaces 22a of the connection part 22 and the upper surface 23a of the flange part 23 such that light is not transmitted through the light-shielding part 3. The light-shielding part 3 is disposed on the outer lateral surfaces 22a of the connection part 22 and the upper surface 23a of the flange part 23, without using an adhesive. Because an adhesive is not used, degradation and/or detachment of an adhesive, and/or absorption of light by the adhesive does not occur.

The light-shielding part 3 is formed of a second resin that is a thermosetting resin having a greater light-absorptance or a greater light-reflectance than the light-transmissive first resin. The second resin 3 is a black resin or a white resin, which is made of a light-transmissive thermosetting resin similar to that used for the first resin, preferably a silicone resin, to which a black material such as carbon having a high light-absorptance or a white material such as titanium oxide having a high light-reflectance is contained. Accordingly, the connection part 22 formed of the light-transmissive first resin is covered by the light-shielding part 3 formed of the second resin having a higher light-absorptance or light-reflectance than that of the first resin.

Light Emitting Device

Next, the light emitting device 100 will be described.

The light emitting device 100 includes a light emitting element 51, a lens 1 having a lens part 21, and preferably a substrate 52, and the lens part 21 is disposed at a location that allows light from the light emitting element to be transmitted through the lens part 21. The light emitting device 100 may further include a light-transmissive member 53. The light emitting device 100 has a lens 1 surrounded by the light-shielding part 3 such that light from the light emitting element 51 is absorbed or reflected by the light-shielding part 3, thus, leaking of light in a lateral side of the lens 1 can be reduced. The lens 1 has been described above, description thereof will be appropriately omitted.

Light Emitting Element

The light emitting element 51 at least includes a nitride semiconductor layered structure. The nitride-based semiconductor layered structure includes the first semiconductor layer (for example, an n-type semiconductor layer), a light emitting layer, and a second semiconductor layer (for example, a p-type semiconductor layer) layered in this order, which generates light. The nitride semiconductor layered body preferably has a thickness not greater than 30 µm.

The materials of the first semiconductor layer, the active layer, and the second semiconductor layer can be appropriately selected. Examples thereof include a Group III-V compound semiconductor and a Group II-VI compound semiconductor. Specific examples include nitride-based semiconductor materials such as $In_XAl_YGa_{1-X-Y}N$ ($0 \leq X$, $0 \leq Y$, $X+Y \leq 1$); for example, InN, AlN, GaN, InGaN, AlGaN, InGaAlN, or the like can be used. For the fluorescent material, a known material in the art can be used. The light emitting elements 51 may generally has a quadrangular shape, but may have a circular shape, an elliptical shape, or a polygonal shape such as a triangular shape or a hexagonal shape.

Light-Transmissive Member

It is preferable that an upper surface of the light emitting element 51 is covered by a light-transmissive member 53, which can be disposed by using a spraying method or the like. The light-transmissive member 53 is configured to protect the light emitting element 51 against external force, dust, moisture, or the like, while improving heat-resisting property, weather-resisting property, and light-resisting property of the light emitting element 51. The light-transmissive member 53 preferably transmit 60% or greater light emitted from the light emitting layer. Such light-transmissive member can be formed of a thermosetting resin, a thermoplastic resin, a modified resin of such a resin, a hybrid resin which includes one or more of those resins, or the like. More specifically, an epoxy/modified epoxy resin, a silicone/modified silicone/hybrid silicone resin or the like, can be used.

In order to adjust the color of emitting light, the light-transmissive member 53 preferably include a fluorescent material that can convert the wavelength of light emitted from the light emitting element 51. For the fluorescent material, a known material in the art can be used. Specific examples thereof include an yttrium aluminum garnet (YAG)-based fluorescent material activated with cerium.

The light-transmissive member 53 may contain a filler (for example, a diffusion agent, a coloring agent, or the like). Examples of the filler material include silica, titanium oxide, zirconium oxide, magnesium oxide, glass, a crystal or sintered body of a phosphor, and a sintered body of a phosphor and an inorganic binding material.

Substrate

The substrate 52 is configured to mount the light emitting element 51 and made of a known base material such as sapphire, spinel, SiC, or the like, provided with a wiring pattern.

The light emitting elements 51 is preferably mounted on the substrate 52 in a flip-chip manner. Either a single or a plurality of light emitting elements 51 may be mounted on the substrate 52. A plurality of light emitting elements 51 may be arranged either randomly or regularly such as in a matrix, or periodically. The plurality of light emitting elements may be connected either in series, in parallel, serial-parallel, or parallel-serial.

Arrangement of Light Emitting Element and Lens

The lens 1 is disposed at a location that allows light from the light emitting element 51 to be transmitted through the lens part 21. The lens 1 is disposed on the substrate 52 through the flange part 23, with the lens part 21 facing the light emitting element 51. Accordingly, the lens 1 is disposed on the substrate 52 with the lens part 21 facing the light emitting element 51, such that light from the light emitting element 51 leaking through the flange part 23 in lateral sides of the lens 1 can be reduced.

The light emitting element 51 is disposed spaced apart from the lens part 21 and the connection part 22. More specifically, a depth of the recess defined by the lens part 21 and the connecting part 22 is in a range of about 0.4 mm to 1.5 mm, such that a distance between the bottom surface of the recess 4 and an upper surface of the light emitting element 51 is in a range of about 0.05 mm to 0.5 mm. With this arrangement, heat from the light emitting element 51 can be prevented from directly conducted to the lens part 21 and thermal degradation of the lens part 21 can be reduced.

In the lens 1, the connection part 22 is formed such that a distance from the lens part (Fresnel lens) 21 to the light emitting element 51 is smaller than a distance from the connection part 22 to the light emitting element 51. In the lens 1, a recess 4 is defined by the lens part (Fresnel lens) 21 and the connection part 22 such that a distance from the lens part (Fresnel lens) 21 to the light emitting element 51 is smaller than a distance from the connection part 22 to the light emitting element 51. More specifically, the center of the light emitting element 51 (or a geometrical center of the light emitting element 51) is opposite to the center of the Fresnel lens 21 (or a geometrical center of the Fresnel lens 21). In other words, the lens 1 is disposed such that the centers of the ridges 21c of the lens 1 arranged in concentric circles or concentric ellipsoids and the center of the light emitting element 51 are aligned When a compound lens including a plurality of lens parts 21 is used, the positions of the light emitting elements 51 may be shifted such that the centers of the light emitting elements 51 come closer to the center of the lens as a whole. With the arrangements of the light emitting element 51 described above, a certain gap can be maintained between the light emitting element 51 and the connection part 22 and between the light emitting element 51 and the flange part 23, such that light of the light emitting element 51 passing through the flange part 23 can be reduced.

Method of Manufacturing Lens

Next, a method of manufacturing a lens will be described.

Figure 5:
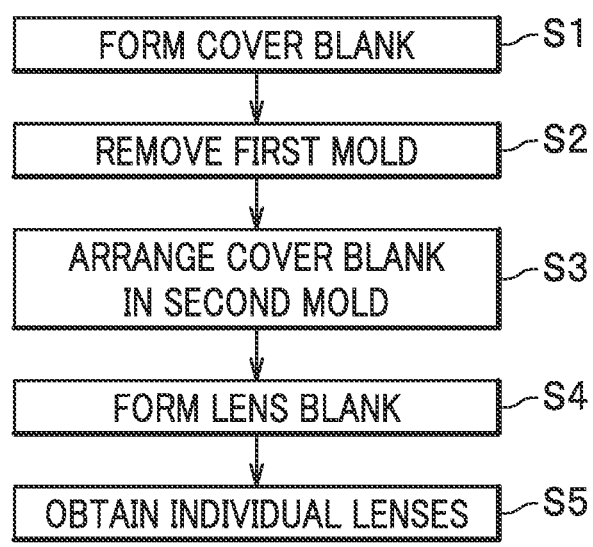
FIG. 5 is a flow chart showing a procedure of a method of manufacturing a lens according to the first embodiment.
Figure 6A:
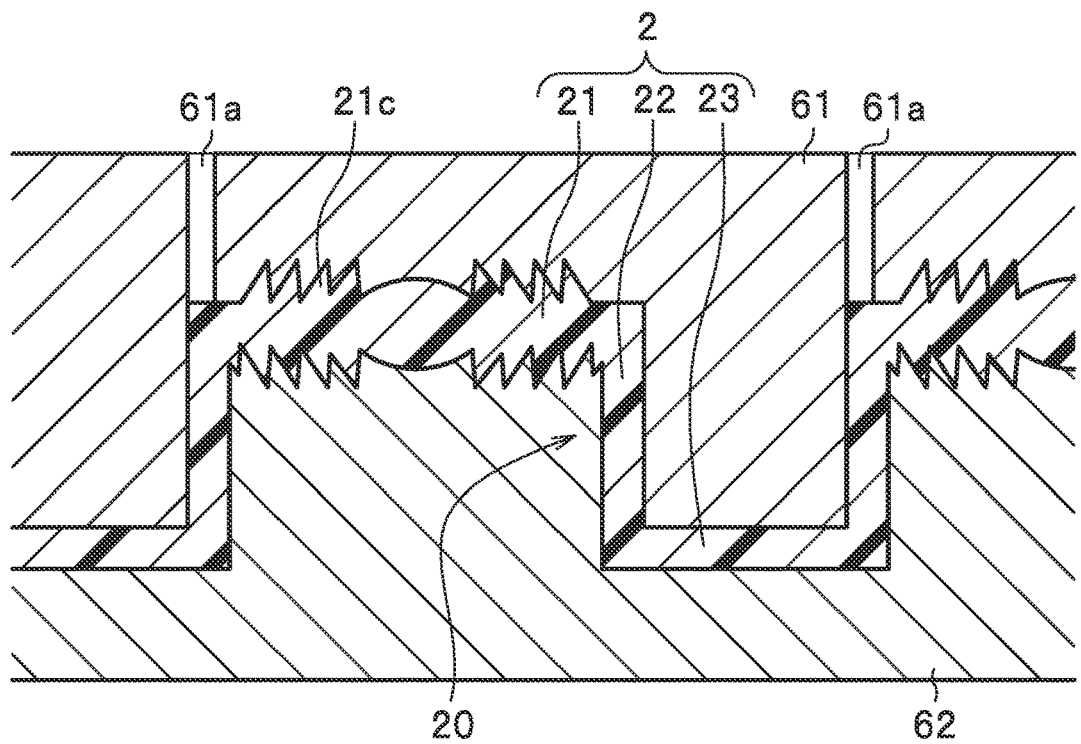
FIG. 6A is a cross-sectional view schematically illustrating forming a cover blank in a method of manufacturing a lens according to the first embodiment.
Figure 6B:
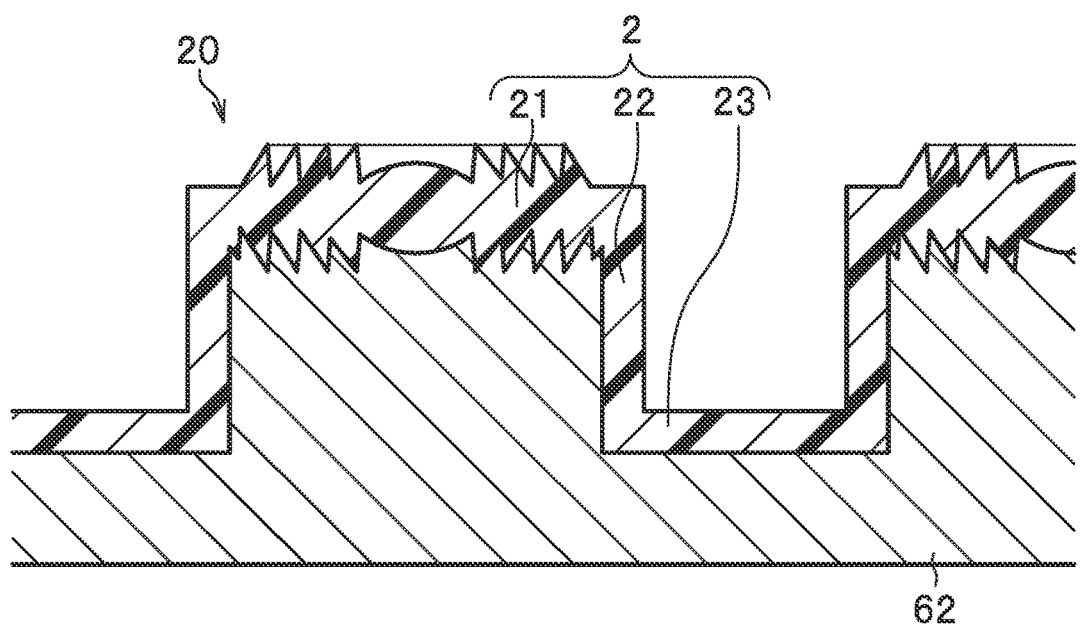
FIG. 6B is a cross-sectional view schematically illustrating removing a first mold in a method of manufacturing a lens according to the first embodiment.
Figure 6C:
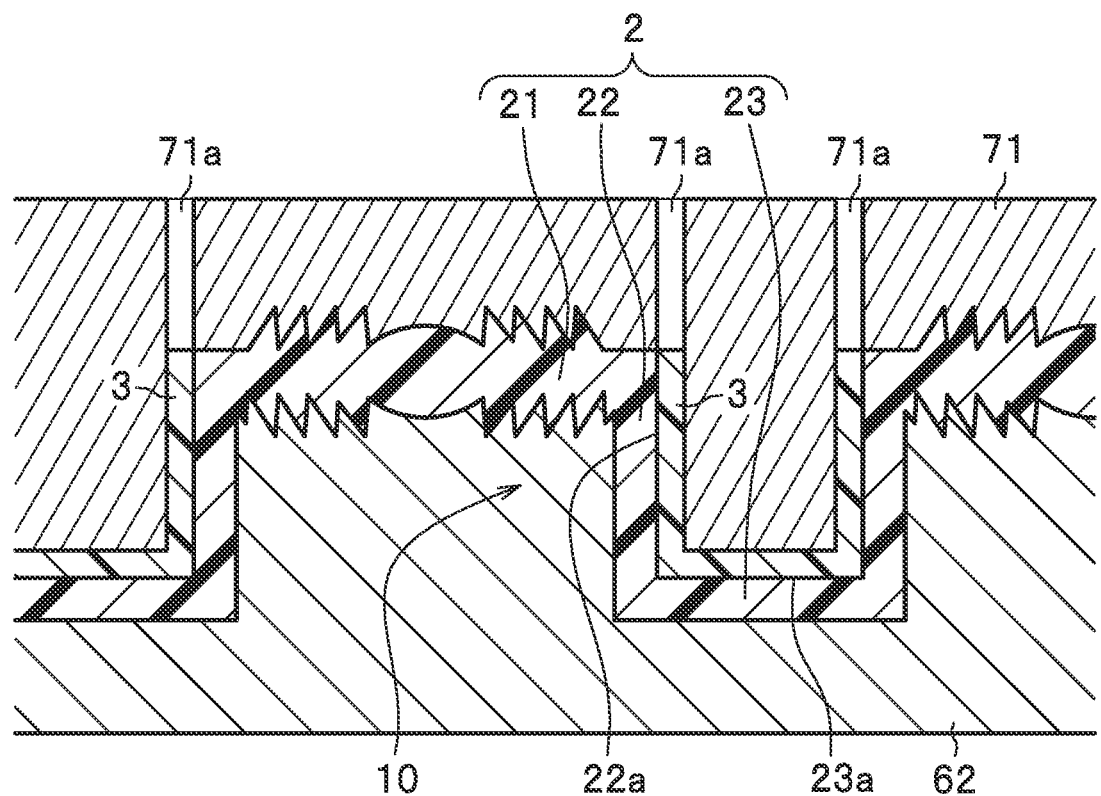
FIG. 6C is a cross-sectional view schematically illustrating arranging a cover blank in a second mold and forming a lens blank in a method of manufacturing a lens according to the first embodiment.
Figure 6D:
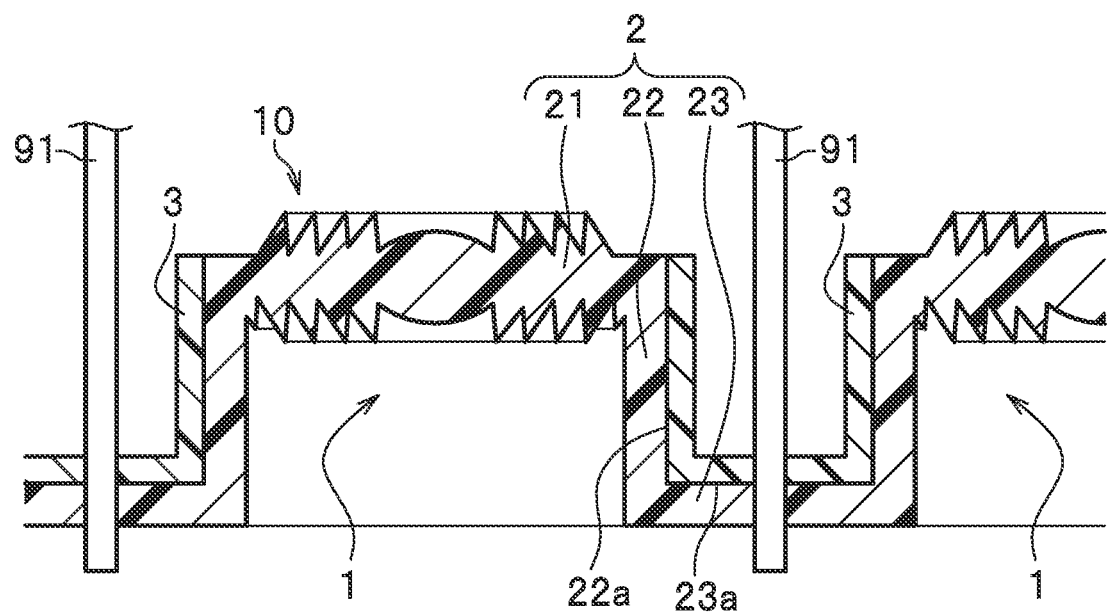
FIG. 6D is a cross-sectional view schematically illustrating cutting a lens blank to obtain individual lenses in a method of manufacturing a lens according to the first embodiment.

FIG. 5 is a flow chart showing a procedure of a method of manufacturing a lens according to the first embodiment. FIG. 6A is a cross-sectional view schematically illustrating forming a cover blank in a method of manufacturing a lens according to the first embodiment. FIG. 6B is a cross-sectional view schematically showing removing a first mold in a method of manufacturing a lens according to the first embodiment. FIG. 6C is a cross-sectional view schematically illustrating arranging a cover blank in a second mold and forming a lens blank in a method of manufacturing a lens according to the first embodiment. FIG. 6D is a cross-sectional view schematically illustrating forming a Lens blank in a method of manufacturing a lens according to the first embodiment.

FIG. 6A to FIG. 6D illustrate producing a plurality of lens at once, but description below focuses on a single lens and description of other adjacent lenses will be omitted.

The method of manufacturing the lens 1 includes forming (S1) a cover blank, removing (S2) a first mold, arranging (S3) the cover blank in a second mold, forming (S4) a lens blank, and obtaining (S5) individual lenses, which are performed in this order. According to the method of manufacturing, the lens 1 with reduced leaking of light can be obtained.

The materials and positional arrangement of respective members are as those described for the lens 1, and therefore the description thereof may be appropriately omitted.

Forming Cover Blank

In the forming (S1) a cover blank, a thermosetting first resin is injected in a first mold to form a cover blank 20 having a plurality of cover parts 2 each having a lens part 21, a connection part 22 connected to an outer periphery of the lens part 21, and a flange part 23 connected to an outer periphery of the connection part 22, in which the lens part 21, the connection part 22, and the flange part 23 are formed continuous with one another.

In the forming (S1) a cover blank, for the first mold, an upper mold 61 and a lower mold 62 adapted for transfer molding is employed. The upper mold 61 and the lower mold 62 are closed, and the first resin, which is heated and softened, is injected under pressure into the first mold through a resin injection port 61a formed in the upper mold 61. The first resin is cured in the mold and a cover blank 20 in which a plurality of cover parts 23 are connected to one another through the flange part 23 is formed.

In the forming (S1) a cover blank, the upper mold 61 and the lower mold 62 are designed such that a molded product of the cover blank 20 includes a plurality of cover parts 2 each formed with a recess 4 defined by a lens part 20 and a connection part 22 with an opening end inward of the flange part 23. Each of the lens parts 21 in the molded product of the cover blank 20 has a plurality of ridges 21c on both the surfaces of the lens part 21. Further, the upper mold 61 and the lower mold 62 are designed such that a molded product of the cover blank 20 includes a plurality of cover parts 2 each having a flange part 23 with a thickness in a range of, for example, 5 μm to 30 μm.

Removing First Mold

In the removing (S2) the first mold, after the cover plank 20 is formed, a part or an entire of the first mold is removed. In the first embodiment, the upper mold 61, which is a part of the first mold, is removed and the molded product of the cover blank 20 is held by the lower mold 62.

Arranging Cover Blank in Second Mold

In the arranging (S3) a cover blank in a second mold, a different second upper mold 71 that is also adapted for transfer molding similarly as the first mold is arranged on the lower mold 62 holding the cover blank 20. In the first embodiment, the second upper mold 71 and the lower mold 62 are used as the second mold.

Forming Lens Blank

In the forming (S4) a lens blank, a second resin having a light-absorptance or a light-reflectance higher than that of the first resin is injected in the second mold and cured to form a lens blank 10 having light-shielding part 3 formed between adjacent cover parts 2.

In the forming a lens blank: S4, the upper mold 71 and the lower mold 62 are closed, and the second resin, which is heated and softened, is injected under pressure into the second mold through a resin injection port 71a formed in the upper mold 71. The second resin is cured in the heated mold, such that a lens blank 10 having the light-shielding part 3 formed in a shape that is bent in conformity to the outer lateral surfaces 22a of the connection part 22 and the upper surface 23a of the flange part 23 is molded.

Obtaining Individual Lenses

In the obtaining (S5) individual lenses, the lens blank 10 is singulated into individual lenses 1. That is, the obtaining individual lenses: S5, all parts of the second mold are removed to take out the lens blank 10, and the lens blank 10 is cut along a center of the light-shielding part 3 formed between adjacent cover parts 2. Accordingly, individual lenses 1 each having outer sides of the connection part 22 covered by the light-shielding part 3 are obtained.

In the obtaining (S5) individual lenses, cutting is performed only along the center of the light-shielding part 3 disposed on the upper surface 23a of the flange part 23 of the lens blank 10, such that the light-shielding part 3 is cut together with the flange part 23, to obtain individual lenses 1 each having the outer lateral surfaces 22a of the connection part 22 and the upper surface 23a of the flange part 23 are covered by the light-shielding part 3. The light-shielding part 3 of the lens 1 has a bent-shape in cross-section along the outer lateral surfaces 22a of the connection part 22 and the upper surfaces 23a of the flange part 23. Cutting of the light-shielding part 3 together with the flange part 23 can be carried out by using a known cutting tool 91 such as a blade. It is preferable that a cutting width of the cutting tool 91 is appropriately adjusted such that the flange part 23 of each lens 1 has a length in a range of 200 μm to 1,000 μm.

Method of Manufacturing Light Emitting Device

Next, a method of producing a light emitting device 100 will be described. Although the method of manufacturing the light emitting device 100 is not shown in the drawings, the method will be illustrated with reference to FIG. 1 and FIG. 4 that show the structure of the light emitting device 100.

The method of manufacturing the light emitting device 100 includes providing a lens and disposing the lens with respect to the light emitting element that has been positioned.

The providing the lens is similar to that in the method of manufacturing the lens, such that redundant description thereof will be omitted.

Disposing Lens

In the disposing a lens, a lens 1 is disposed such that light from the light emitting element 51 is transmitted through the lens part 21 of the lens part 21. In the disposing a lens, the lens 1 is disposed such that the light emitting element 51, preferably the light emitting element 51 disposed on the substrate 52, is accommodated in a recess 4 defined by the lens part 21 and the connection part 22, and located inward of the flange part 23. The light emitting element 51 may be covered by the light-transmissive member 53.

In the disposing a lens, the light emitting element 51 is preferably mounted on the substrate 52, in which the light emitting element 51 is preferably mounted in a flip-chip manner on the substrate 52. It is preferable that the light emitting element 51 is mounted on the substrate 52 and then the flange part 23 is connected to the substrate 52. Further, in the disposing a lens, the lens 1 is disposed such that the connection part 22 and the lens part 21 of the lens 1 are spaced apart from the light emitting element 51. More specifically, the bottom surface in the recess 4 is spaced apart from the uppermost surface which is either the upper surface of the light emitting element 51 or the upper surface of the light-transmissive member 53 in a range of 0.05 mm to 0.5 mm. Further, in the disposing a lens, the connection part 22 (i.e., the recess 4) is preferably formed such that a distance between the lens part 21 and the light emitting element 51 is smaller than the distance between the connection part 22 and the light emitting element 51. More specifically, the center of the light emitting element 51 (or a geometrical center of the light emitting element 51) preferably aligned with the center of the lens part (the Fresnel lens) 21 (or a geometrical center of the lens part (Fresnel lens) 21), that is, the center of the ridges 21c arranged in concentric circles or concentric ellipsoids.

Second Embodiment

Next, a second embodiment will be described with reference to FIG. 7.

Figure 7:
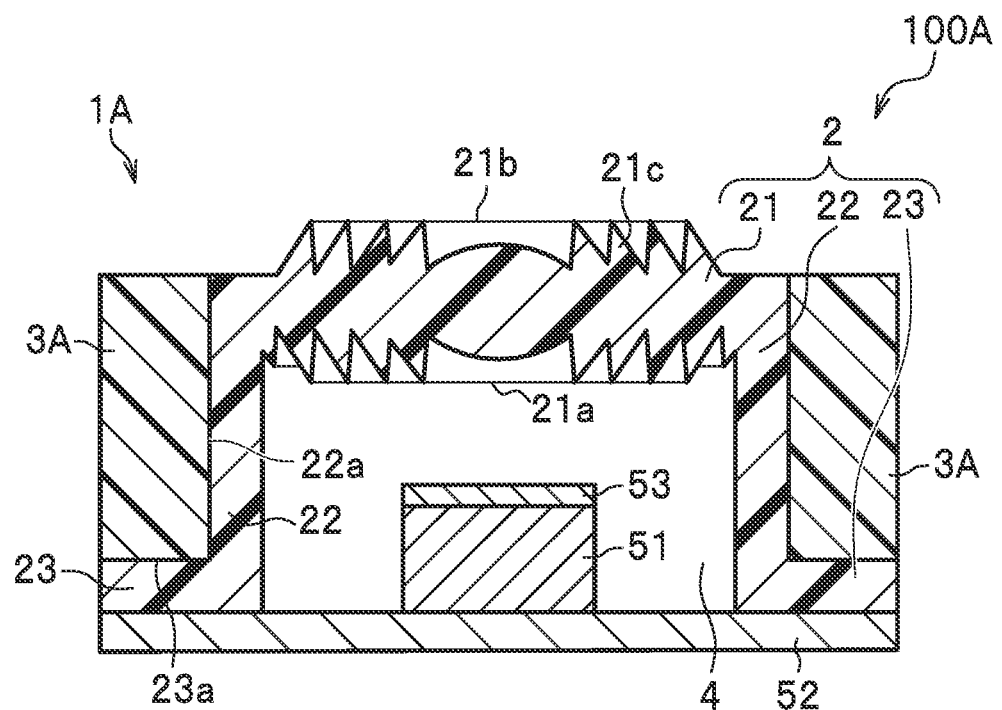
FIG. 7 is a cross-sectional view schematically showing a structure of a light emitting device that includes a lens according to a second embodiment, taken along a line passing through the center of the light emitting device.

FIG. 7 is a cross-sectional view schematically showing a structure of a light emitting device that includes a lens according to the second embodiment, taken along a line passing through the center of the light emitting element. The same reference numerals may be applied to the components that have been described above and description thereof may be appropriately omitted.

Lens and Light Emitting Device

Lens 1A and light emitting device 100A will be described below.

In the lens 1A and the light emitting device 100A according to the second embodiment, the light-shielding part 3A has a large thickness, which is a rectangular shape in a cross-section that is in conformity to the shapes of the outer lateral surfaces 22a of the connection part 22, which differs from the shape according to the first embodiment, which is a bent shape along the outer lateral surface 22a of the connection part 22 and the upper surface 23a of the flange part 23a. The other parts of the structure are similar to those of the lens 1 and the light emitting device 100 according to the first embodiment.

The lens 1A and the light emitting device 100A according to the second embodiment having the light-shielding part 3A of such a large thickness can yield further reduction of leaking light.

Method of Manufacturing Lens

Next, a method of manufacturing the lens 1A will be described.

Figure 8A:
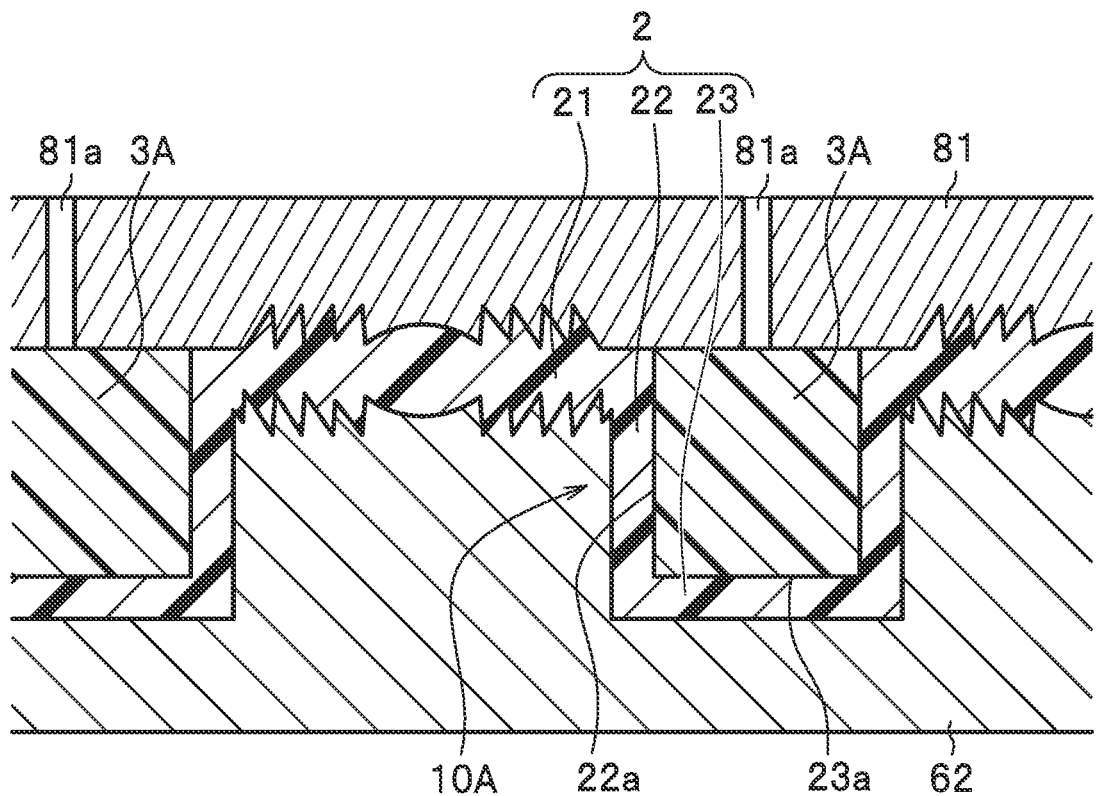
FIG. 8A is a cross-sectional view schematically illustrating arranging a cover blank in a second mold to form a lens blank in a method of manufacturing a lens according to the second embodiment.
Figure 8B:
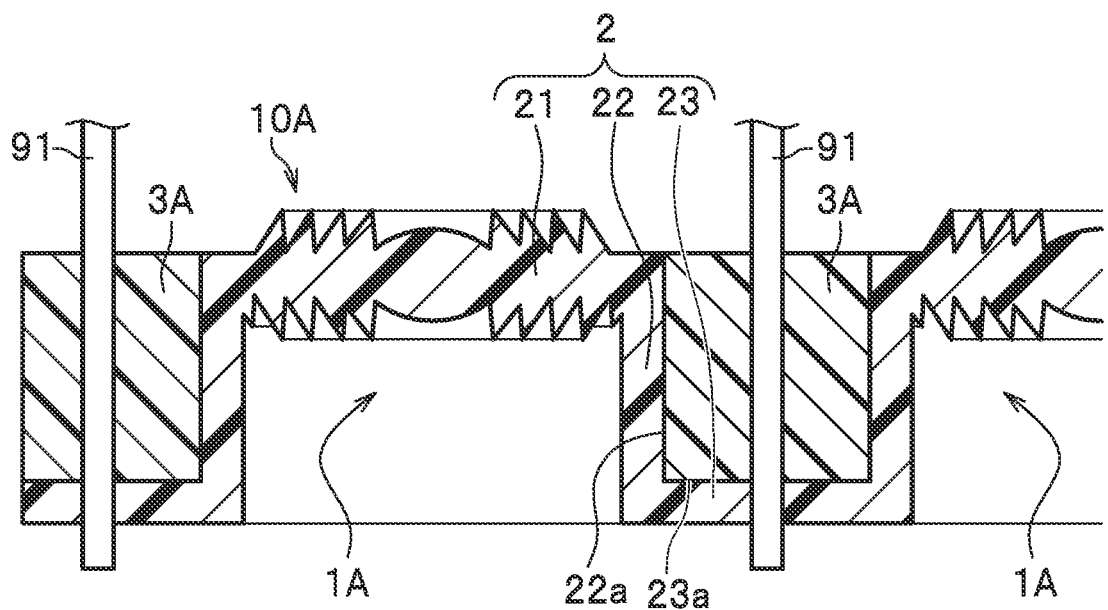
FIG. 8B is a cross-sectional view schematically illustrating cutting a lens blank to obtain individual lenses.

FIG. 8A is a cross-sectional view schematically illustrating forming a cover blank in a method of manufacturing a lens according to the second embodiment. FIG. 8A is a cross-sectional view schematically illustrating forming a lens blank in a method of manufacturing a lens according to the second embodiment.

A method of manufacturing the lens 1A includes, similar to the method of manufacturing the lens according to the first embodiment, forming (S1) a cover blank, removing (S2) a first mold, arranging (S3) the cover blank in a second mold, forming (S4) a lens blank, and obtaining (S5) individual lenses, which are performed in this order.

In the method of manufacturing the lens 1A which is similar to those described above, except that in the step S3 of arranging the cover blank 20 in the second mold, the cover blank 20 is arranged in a second mold (an upper mold 81 and a lower mold 62) which is different from the second mold (the upper mold 71 and the lower mold 62) described above. Also, in the forming (S4) a lens blank 10A, a thermosetting second resin having a light-absorptance or a light-reflectance higher than that of the first resin is injected in the mold and cured, to obtain a lens blank 10A with a light-shielding part 3A disposed between adjacent cover parts 2 and having a rectangular shape in a cross section, which is in conformity to the shapes of the outer lateral surfaces 22a of the connection part 22. Further, in the step S5 of obtaining individual lenses 1A, a center of the light-shielding part 3A between outer lateral surfaces 22a of two adjacent connection parts 22 of the lens blank 10A is cut together with the flange part 23 to obtain individual lenses 1A, a respective one of which having the outer lateral surfaces 22a of the connection part 22 and the upper surface 23a of the flange part 23 covered by the light-shielding part 3. The light-shielding part 3A of the lens 1A thus obtained has a cross-sectional shape of a rectangular shape in conformity to the shape of the outer lateral surfaces 22a of the connection part 22 and the upper surface of the flange part 23. Others are similar to those in the method of manufacturing the lens 1. According to the first embodiment.

Method of Manufacturing Light Emitting Device

Next, a method of manufacturing a light emitting device 100 will be described.

The method of manufacturing the light emitting device 100A includes providing a lens 1A and arranging a light emitting element 51, which are performed in this order. The method of manufacturing the light emitting device 100A is similar to the method of manufacturing the light emitting device 100 according to the first embodiment.

Third Embodiment

Next, a third embodiment will be described with reference to FIG. 9.

Figure 9:
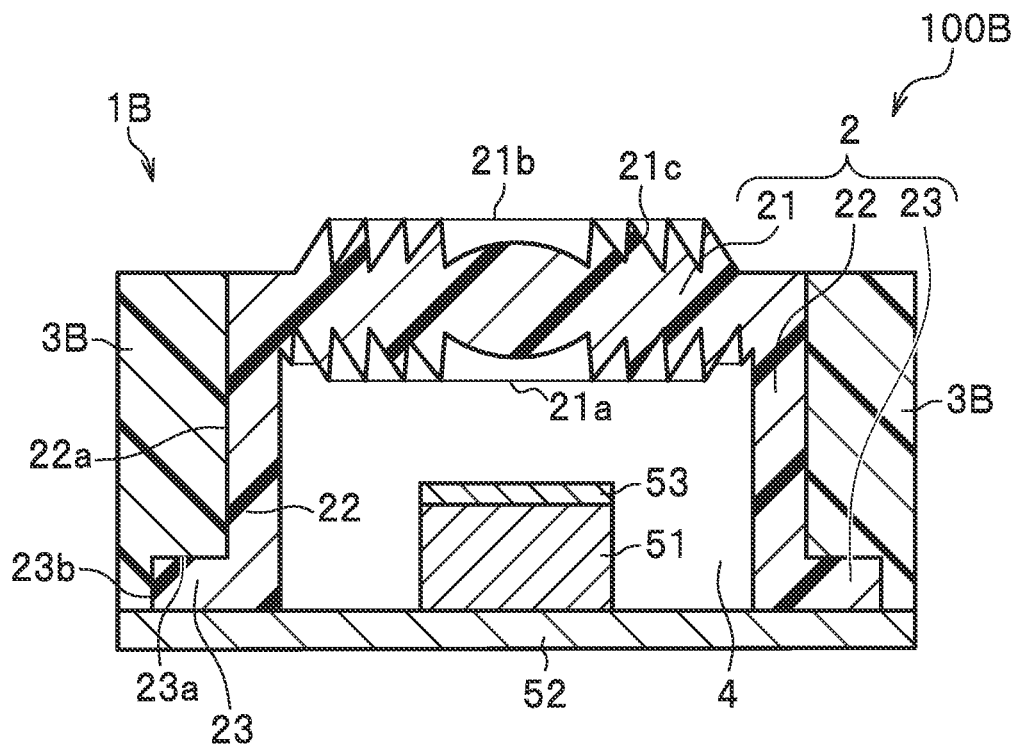
FIG. 9 is a cross-sectional view schematically showing a structure of a light emitting device that includes a lens according to a third embodiment, taken along a line passing through the center of the light emitting device.

FIG. 9 is a cross-sectional view schematically showing a structure of a light emitting device that includes a lens according to the third embodiment, taken along a line passing through the center of the light emitting device. In the description below, the same reference numerals will be applied to the same or similar structures and description thereof will be appropriately omitted.

Lens and Light Emitting Device

Next, lens 1B and light emitting device 100B will be described.

The lens 1B and the light emitting device 100B according to a third embodiment differ from the lens 1A and the light emitting device 100A according to the second embodiment in which the light-shielding part 3B has a thickness greater than that of the light-shielding part 3A of the second embodiment and covers end-surfaces 23b of the flange 23. Others are similar to the lens 1A and the light emitting device 100A according to the second embodiment.

The lens 1B and the light emitting device 100B according to the third embodiment has the light-shielding part 3B having a greater thickness and covering the outer end-surfaces 23B as described above, and thus can further reduce light leaking through the light-shielding part 3B.

Method of Manufacturing Lens

Next, a method of manufacturing a lens 1B will be described.

Figure 10:
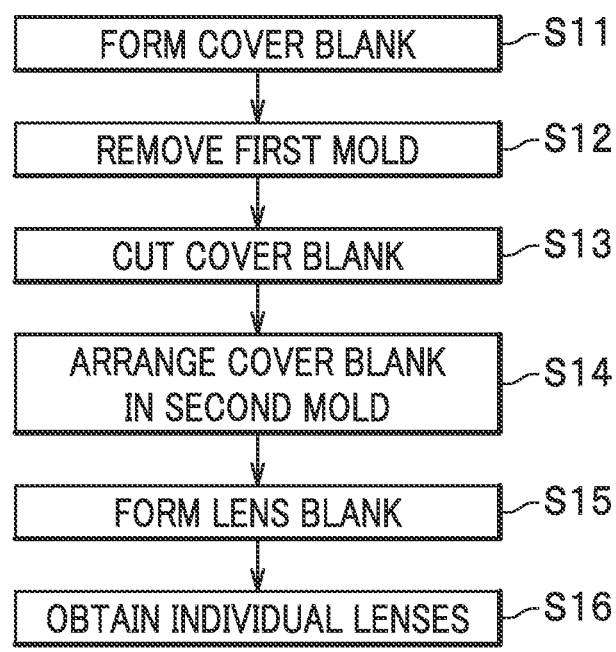
FIG. 10 is a flow chart showing a procedure of a method of manufacturing a lens according to the third embodiment.
Figure 11A:
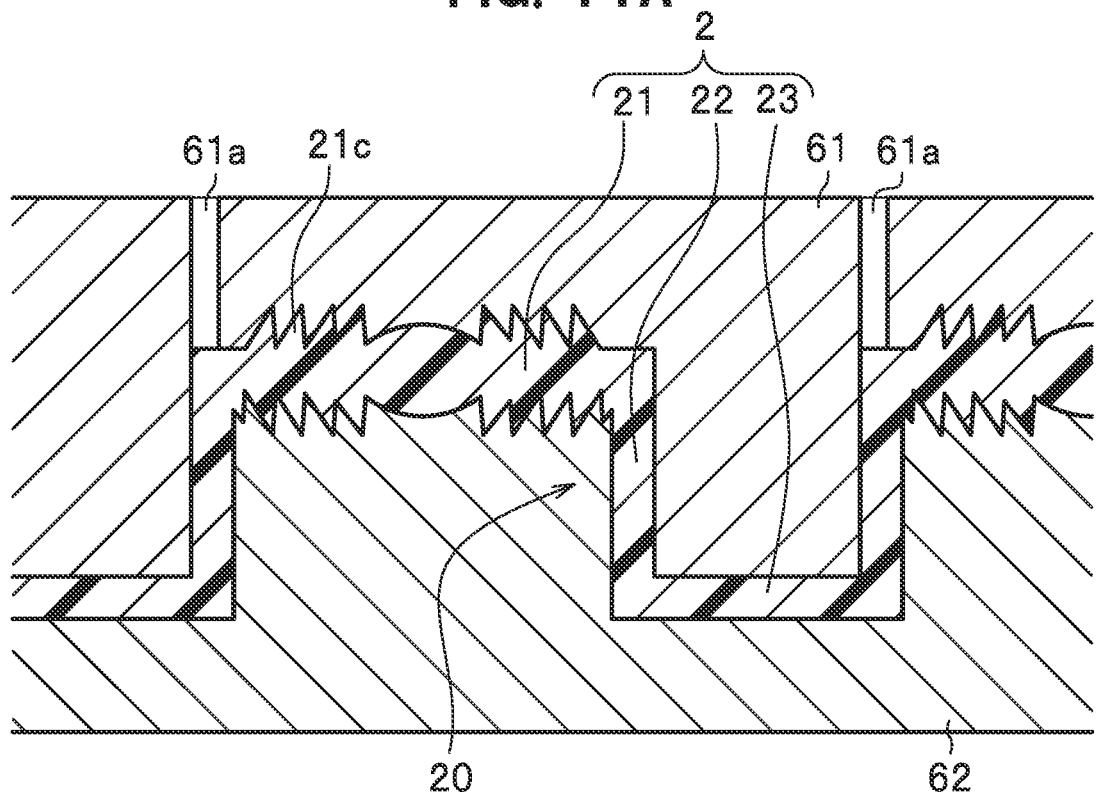
FIG. 11A is a cross-sectional view schematically illustrating forming a cover blank in a method of manufacturing a lens according to the third embodiment.
Figure 11B:
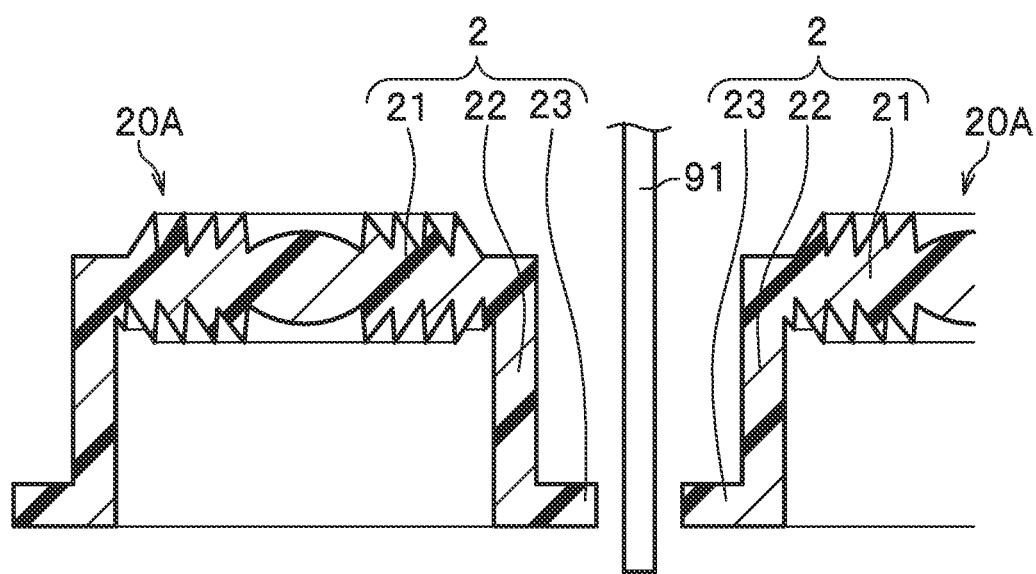
FIG. 11B is a cross-sectional view schematically illustrating cutting a cover blank in a method of manufacturing a lens according to the third embodiment.
Figure 11C:
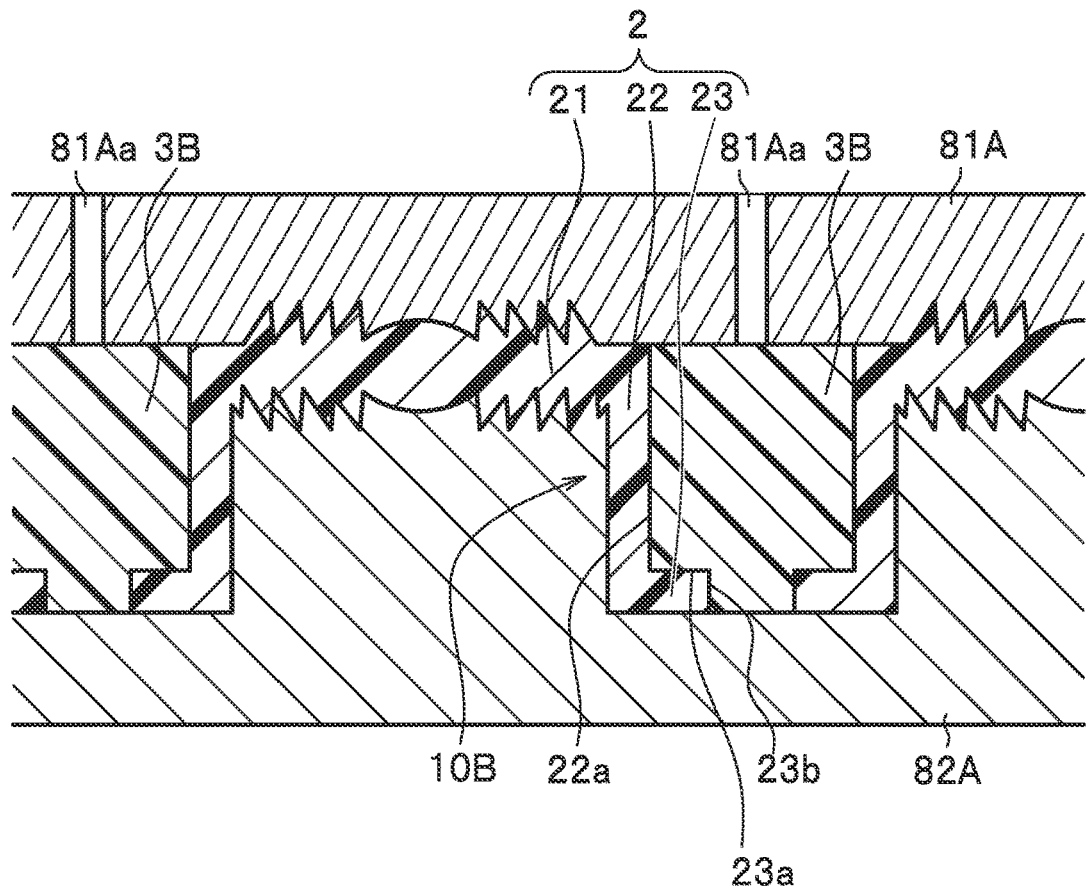
FIG. 11C is a cross-sectional view schematically illustrating arranging a cut cover blank in a second mold and forming a lens blank in a method of manufacturing a lens according to the third embodiment.
Figure 11D:
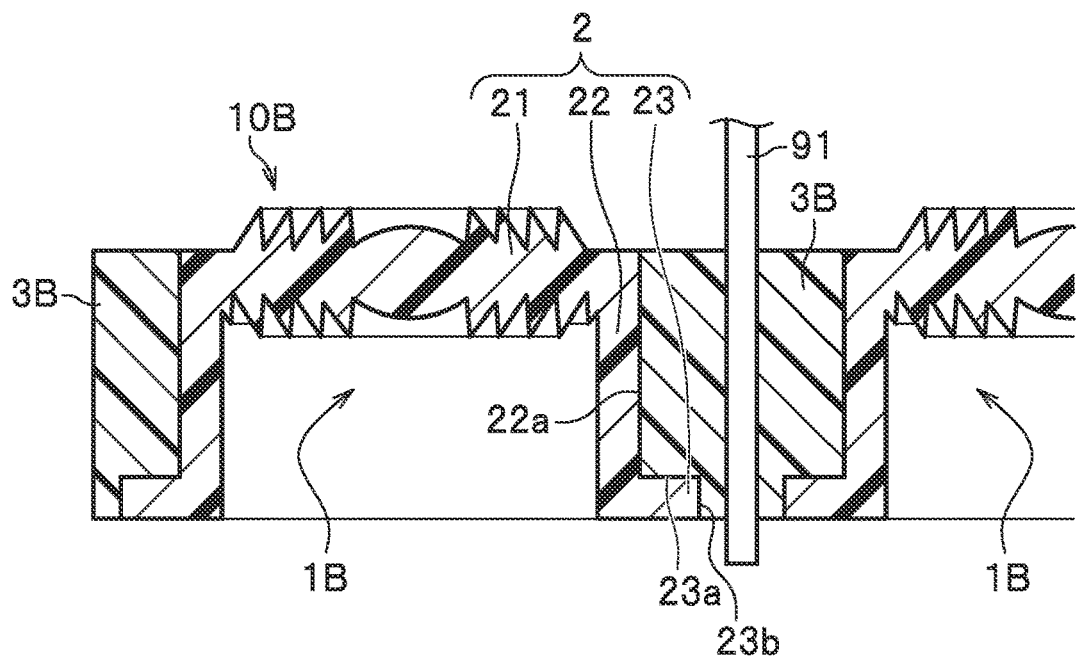
FIG. 11D is a cross-sectional view schematically illustrating cutting a lens blank to obtain individual lenses in a method of manufacturing a lens according to the third embodiment.

FIG. 10 is a flow chart showing a procedure of a method of manufacturing a lens according to the third embodiment. FIG. 11A is a cross-sectional view schematically illustrating forming a cover blank in the method of manufacturing a lens according to the third embodiment. FIG. 11B is a cross-sectional view schematically illustrating cutting a cover blank in the method of manufacturing a lens according to the third embodiment. FIG. 11C is a cross-sectional view schematically illustrating arranging a cut cover blank in a second mold and forming a lens blank in a method of manufacturing a lens according to the third embodiment. FIG. 11D is a cross-sectional view schematically illustrating cutting a lens blank to obtain individual lenses in a method of manufacturing a lens according to the third embodiment.

The method of manufacturing a lens 1B includes forming (S11) a cover blank, removing (S12) a first mold, cutting (S13) the cover blank, arranging (S14) the cover blank in a second mold, forming (S15) a lens blank, and obtaining (S16) individual lenses, which are performed in this order, accordingly, a lens 1B allowing for a reduction of leaking light can be manufactured.

The materials and arrangements of components are similar to those described above for the lens 1B and therefore redundant description will be appropriately omitted below.

Forming Cover Blank

As shown in FIG. 11A, in the forming (S11) a cover blank, a thermosetting first resin is injected in a first mold to form a cover blank 20 having a plurality of cover parts 2 each having a lens part 21 having a plurality of lateral surfaces, a connection part 22 connected to the plurality of lateral sides of the lens part and having a plurality of outer lateral sides, and a flange part 23 connected to a lower-end portion of the outer lateral sides of the connection part 22, in which the lens part 21, the connection part 22, and the flange part 23 are formed continuous with one another.

In the forming (S11) a cover blank, an upper mold 61 and a lower mold 62 adapted for transfer molding can be used as the first mold. The upper mold 61 and the lower mold 62 are closed, and the first resin, which is heated and softened, is injected under pressure into the first mold through a resin injecting port 61a formed in the upper mold 61. The first resin is cured in the heated mold, such that a cover blank 20 having a plurality of cover parts 2 connected one another through the flange part 23 is molded.

In the forming (S11) a cover blank, the upper mold 61 and the lower mold 62 are designed to produce a cover blank 20 having a plurality of cover parts 2 each formed with a recess defined by the lens part 21 and the connection part 22, and located inward of the flange part 23. Each of the lens parts 21 of the cover blank 20 has a plurality of ridges 21c at both upper and lower sides. Further, in the forming (S11) a cover blank, the upper mold 61 and the lower mold 62 are designed to produce a cover blank 20 having a plurality of cover parts 2 each having the flange part 23 with a thickness in a range of 5 μm to 30 μm.

Removing First Mold

In the removing (S12) the first mold, the first mold is removed after the cover blank 20 is formed. In this step, all parts (the upper mold 61 and the lower mold 62) of the first mold are removed.

Cutting Cover Blank

As shown in FIG. 11B, in the cutting (S13) the cover blank, the cover blank 20 is cut at the flange part 23 between adjacent cover parts 2 to obtain individual cover blanks 20A. Cutting of the cover blank 20 can be performed by using a cutting tool 91 such as a known blade or the like. It is preferable to adjust the cutting width of the cutting tool 91 such that the flange part 23 of the individual cover blank 20A has a length in a range of 200 μm to 3,000 μm.

Arranging Cover Blank in Second Mold

In the arranging (S14) the cover blank in the second mold, cut cover blank 20 (singulated cover blank 20A) is arranged in another upper mold 81A and a lower mold 82A adapted for transfer molding.

Forming Lens Blank

In the forming (S15) a lens blank, a thermosetting second resin having a greater light-absorptance or a greater light-reflectance than the first resin is injected in the second mold and cured, to form a lens blank 10B having a light-shielding part 3 between adjacent cover parts 2.

In the forming (S15) a lens blank, the upper mold 81A and the lower mold 82A are closed, and the second resin, which is heated and softened, is injected under pressure into the second mold through a resin injecting port 81Aa formed in the upper mold 81A. The second resin is cured in the heated mold, such that a lens blank 10B having a light-shielding part 3B between adjacent cover parts 2, in a rectangular shape in a cross-section that is in conformity to the shape of the outer lateral surface 22a of the connection part 22 and covering the outer end surfaces 23b of the flange part 23 is molded.

Obtaining Individual Lenses

As shown in FIG. 11D, in the obtaining (S16) individual lenses, the lens blank 10B is singulated into individual lenses 1B. That is, in the obtaining individual lenses: S16, all parts of the second mold are removed to take out the lens blank 10B, and the lens blank 10B is cut at a center of the light-shielding part 3B between adjacent cover parts 2. The singulating is performed by cutting at the light-shielding part 3B, thus obtaining individual lenses 1B each having the light-shielding part 3B covering the outer lateral surfaces of the connection part 22 and also covering the outer end surfaces 23b of the flange part 23.

In the obtaining (S16) individual lenses, the lens blank 10B is cut at the center of the light-shielding part 3B between the outer lateral surfaces 22a of adjacent connection parts 22 and between outer end surfaces 23b of adjacent flange parts 23, to obtain individual lenses 1B each having the light-shielding part 3 covering the outer lateral surfaces 22a of the connection part 22, the upper surface 23a of the flange part 23, and the outer end surfaces of the flange part 23. In a cross-section, the light-shielding part 3B of each of the individual lenses 1B has a rectangular shape in conformity to the shapes of the outer lateral surfaces 22a of the connection part 22 and covering the outer end surfaces 23b of the flange part 23. Cutting of the light-shielding part 3B can be performed by using a cutting tool 91 such as a known blade or the like.

Method of Manufacturing Light Emitting Device

Next, a method of manufacturing a light emitting device 100B will be described.

The method of manufacturing the light emitting device 100B includes providing a lens and disposing the lens with respect to the light emitting element that has been positioned. The method of manufacturing the light emitting device 100B can be performed in a similar manner as in the method of manufacturing the light emitting device 100 according to the first embodiment, except for using the lens 1B.

Fourth Embodiment

Figure 12:
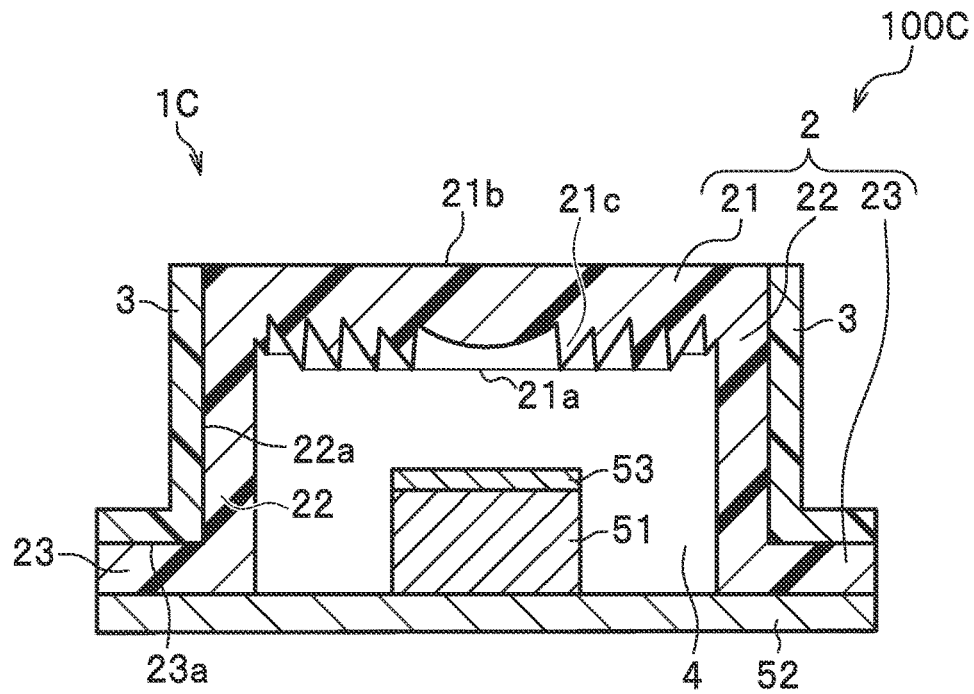
FIG. 12 is a cross-sectional view schematically showing a structure of a light emitting device that includes a lens according to a fourth embodiment, taken along a line passing through the center of the light emitting device.

As shown in FIG. 12, a plano-convex Fresnel lens having a plurality of ridges 21c on either outer surface or inner surface (in FIG. 12, the light-incident surface 21a) may be used in the lens part 21 of the lens 1C and the light emitting device 100C.

It is preferable that the lens part 21 has a light incident surface with a plurality of ridges 21c, and a flat or substantially flat light-emitting surface 21b such that the light-emitting surface 21b of the lens part 21 can be arranged in parallel to the light emitting surface of the light emitting element 51. The light-emitting surface 21b may have microscopic projections lower than the ridges 21c, and formed by emboss processing, mat processing, or the like. With this, light emitted from the light-emitting surface 21b can be uniformly dispersed. FIG. 12 is a cross-sectional view schematically showing a structure of a light emitting device that includes a lens according to a fourth embodiment, where the light emitting device is cut through its center. Also, when a compound eye lens is used, a structure having the plurality of ridges 21c either in the outward surface or the inward surface may be employed. As in the lens 1C and the light emitting device 100C, employing a structure having a plurality of ridges 21c only in one surface (in this case the inward surface) of the lens part 21 allows for a reduction in a dimension in height direction, because the outward surface does not have the plurality of ridges 21c.

Fifth Embodiment

Figure 13:
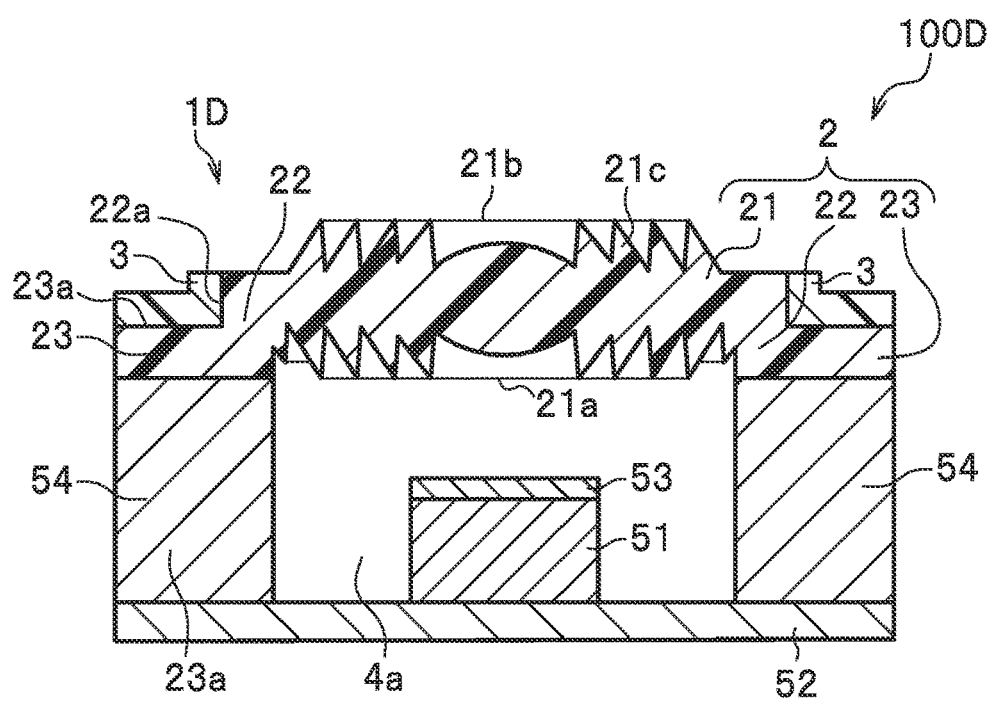
FIG. 13 is a cross-sectional view schematically showing a structure of a light emitting device that includes a lens according to a fifth embodiment, taken along a line passing through the center of the light emitting device.

As shown in FIG. 13, a lens 1D may have a structure in which a connection part 22 is connected to the lateral sides of the lens part 21 and extended outward with respect to the lateral sides of the lens part 21, and a flange part 23 is connected to lower end part of the connection part 22. A light emitting device 100D according to the fifth embodiment may have a structure in which the lens 1D and a substrate 52 having a light emitting element 51 mounted thereon are bonded through an interposing member 54 which is formed of a light-reflecting material and disposed on the substrate 52. FIG. 13 is a cross-sectional view schematically showing a structure of a light emitting device that includes a lens according to a fifth embodiment, where the light emitting device is cut through its center.

In the lens 1D, outer lateral sides of the connection part 22 and upper surfaces of the flange part 23 are covered by a light-shielding part 3. In the lens 1D and the light emitting device 100D, a recess 4a is defined by the lens part 21, a portion of the connection part 22, and the interposing member 54.

In the case of the lens 1D, the lower surface of the flange part 23 is bonded to the substrate through the interposing member 54 such that the lens part 21 is located facing the light emitting element 51 mounted on the substrate 52.

In the light emitting device 100D, the height of the interposing layer 54 is determined such that the light emitting element 51 mounted on the substrate 52 is spaced apart from the lens part 21 of the lens 1D.

In the lens 1D and the light emitting device 100D, the outer lateral surfaces of the flange part 23 and the outer lateral surfaces of the interposing member 54 may also be covered by the light-shielding part 3.

Obviously, numerous modifications and variations of the present invention are possible in light of the above teachings. It is therefore to be understood that within the scope of the appended claims, the invention may be practiced otherwise than as specifically described herein.

What is claimed is:

1. A lens comprising:
    a cover part comprising:
        a lens part including a Fresnel bi-convex lens;
        a connection part connected to an outer periphery of the lens part;
        a flange part connected to a lower-end portion of an outer periphery of the connection part;
        the lens part and the connection part defining a recess opening downward, the lens part defining a bottom surface of the recess;
        the connection part comprising:
            inner lateral surfaces defining lateral surfaces of the recess and surrounding an opening of the recess; and
            outer lateral surfaces opposite to the inner lateral surfaces to surround the inner lateral surfaces;
        the flange part extending outward from a periphery of the recess, the flange part comprising:
            an upper surface extending outward from the outer lateral surfaces of the connection part; and
            an outer end surface extending downward from the upper surface; and
        the lens part, the flange part, and the connection part being formed of a thermosetting first resin and continuous to one another; and
    a light-shielding part covering the outer lateral surfaces of the connection part and the upper surface and the outer end surface of the flange part, the light-shielding part being formed of a thermosetting second resin having a greater light-absorptance or a greater light-reflectance than the first resin.

2. The lens according to claim 1, wherein at least one of either the first resin or the second resin is silicone resin.

3. The lens according to claim 1, wherein the flange part has a length in a range of 200 µm to 3,000 µm.

4. The lens according to claim 1, wherein the light-shielding part has a thickness in a range of 200 µm to 3,000 µm.

5. The lens according to claim 1, wherein the flange part entirely surrounds the lower-end portion of the lens part.

6. The lens according to claim 1, wherein the Fresnel bi-convex lens includes a plurality of ridges arranged in concentric ellipsoids in a radial direction of the Fresnel bi-convex lens.

7. The lens according to claim 1, wherein the light-shielding part covers an entirety of the outer lateral surfaces of the connection part.

8. The lens according to claim 1, wherein the light-shielding part is in direct contact with and covers an entirety of the outer end surface of the flange part.

9. A lens comprising:
    a cover part comprising:
        a lens part including a Fresnel bi-convex lens;
        a connection part connected to an outer periphery of the lens part;
        a flange part connected to a lower-end portion of an outer periphery of the connection part;
        the lens part and the connection part defining a recess opening downward;
        the connection part comprising:
            inner lateral surfaces defining lateral surfaces of the recess; and
            outer lateral surfaces opposite to the inner lateral surfaces to surround the inner lateral surfaces;
        the flange part extending outward from a periphery of the recess, the flange part comprising:
            an upper surface extending outward from the outer lateral surfaces of the connection part; and
            an outer end surface extending downward from the upper surface; and
        the lens part, the flange part, and the connection part being formed of a thermosetting first resin and continuous to one another, with a thickness of the flange part in a range of 5 µm to 30 µm; and
    a light-shielding part covering the outer lateral surfaces of the connection part and the upper surface and the outer end surface of the flange part, the light-shielding part being formed of a thermosetting second resin having a greater light-absorptance or a greater light-reflectance than the first resin.

10. The lens according to claim 9, wherein the lens part defines a bottom surface of the recess.

11. The lens according to claim 9, wherein the Fresnel bi-convex lens includes a plurality of ridges arranged in concentric ellipsoids in a radial direction of the Fresnel bi-convex lens.

12. The lens according to claim 9, wherein the light-shielding part covers an entirety of the outer lateral surfaces of the connection part.

13. The lens according to claim 9, wherein the light-shielding part is in direct contact with and covers an entirety of the outer end surface of the flange part.

* * * * *